(12) United States Patent
Inagaki et al.

(10) Patent No.: US 9,343,339 B2
(45) Date of Patent: May 17, 2016

(54) COATING METHOD AND COATING APPARATUS

(71) Applicants: Yukihiko Inagaki, Kyoto (JP); Tomohiro Goto, Kyoto (JP)

(72) Inventors: Yukihiko Inagaki, Kyoto (JP); Tomohiro Goto, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 691 days.

(21) Appl. No.: 13/633,705

(22) Filed: Oct. 2, 2012

(65) Prior Publication Data

US 2013/0089668 A1    Apr. 11, 2013

(30) Foreign Application Priority Data

Oct. 5, 2011    (JP) .................. 2011-221100

(51) Int. Cl.
  *B05C 11/06*    (2006.01)
  *B05D 3/04*    (2006.01)
  *H01L 21/67*    (2006.01)

(52) U.S. Cl.
  CPC ............ *H01L 21/6715* (2013.01); *B05C 11/06* (2013.01); *B05D 3/04* (2013.01)

(58) Field of Classification Search
  None
  See application file for complete search history.

(56) References Cited

U.S. PATENT DOCUMENTS

| | | | |
|---|---|---|---|
| 5,935,331 A | 8/1999 | Naka et al. | 118/319 |
| 6,207,231 B1* | 3/2001 | Tateyama | B05C 11/08 |
| | | | 118/315 |
| 2002/0152954 A1 | 10/2002 | Takamori et al. | 118/52 |
| 2003/0056722 A1 | 3/2003 | Kitano et al. | 118/323 |
| 2010/0221449 A1* | 9/2010 | Schlatterbeck et al. | 427/558 |
| 2011/0117291 A1* | 5/2011 | Hiroshiro et al. | 427/553 |

FOREIGN PATENT DOCUMENTS

| | | |
|---|---|---|
| JP | 8-250389 | 9/1996 |
| JP | H09-10657 A | 1/1997 |
| JP | 2002-28552 | 1/2002 |
| JP | 2002-66391 | 3/2002 |
| JP | 2002-066391 | 3/2002 |
| JP | 2003-290686 | 10/2003 |
| JP | 2004-221244 | 8/2004 |
| JP | 2005-246312 | 9/2005 |
| JP | 2006-035044 | 2/2006 |
| JP | 2006-341251 | 12/2006 |

(Continued)

OTHER PUBLICATIONS

Korean Office Action dated Nov. 27, 2013, issued in corresponding Korean Patent Application No. 10-2012-0101580. (8 pages).
Notice of Allowance dated May 20, 2014 for corresponding Korean Patent Application No. 10-2012-0101580.

(Continued)

*Primary Examiner* — Shamim Ahmed
*Assistant Examiner* — Bradford Gates
(74) *Attorney, Agent, or Firm* — Ostrolenk Faber LLP (57) ABSTRACT

A coating head is constructed of a solvent feed mechanism connected to a forward side in a direction of movement of a coating solution feed mechanism, and a gas jet mechanism connected to a rearward side in the direction of movement. While moving the coating head relative to a substrate, a solvent is supplied onto the substrate from the solvent feed mechanism, then a coating solution is supplied onto a film of the solvent from the coating solution feed mechanism, and finally a gas is jetted to an uneven surface of the coating solution from the gas jet mechanism to smooth a thin film surface of the coating solution.

4 Claims, 5 Drawing Sheets

(56) References Cited

FOREIGN PATENT DOCUMENTS

| | | |
|---|---|---|
| JP | 2007-183319 | 7/2007 |
| JP | 2010-179195 | 8/2010 |
| KR | 1999-0088393 | 12/1999 |
| KR | 2003-0023498 | 3/2003 |
| KR | 10-0523224 | 10/2005 |

OTHER PUBLICATIONS

Notice of Reason for Refusal dated Mar. 17, 2015 for Japanese Patent Application No. 2011-221100.
Office Action and Search Report dated Mar. 27, 2015 for corresponding Taiwan Patent Application No. 101137002.

* cited by examiner

COATING METHOD AND COATING APPARATUS

BACKGROUND OF THE INVENTION (1) Field of the Invention

This invention relates to a coating method and a coating apparatus for applying a coating solution, e.g. photoresist, uniformly over surfaces of substrates such as semiconductor wafers, glass substrates for liquid crystal display panels, or mask substrates for semiconductor manufacturing apparatus. More particularly, the invention relates to a technique for applying a coating solution in an inkjet mode to substrates.

(2) Description of the Related Art

Conventionally, a spin coat method is known as the coating method for applying a coating solution uniformly over each substrate. The spin coat method is a technique for forming a thin film of the coating solution on a substrate surface by supplying the coating solution to a central position on the surface of the substrate, and rotating the substrate at high speed to spread the coating solution over the substrate by centrifugal force. In the spin coat method, an excess part of the coating solution is spun off the edges of the substrate to be wasted in the course of the high speed rotation of the substrate. This constitutes a bad use efficiency of the coating solution.

On the other hand, techniques for forming a thin film of a coating solution on a substrate surface have been proposed in recent years, which supply the coating solution to the substrate surface using nozzles in an inkjet mode (as disclosed in Japanese Unexamined Patent Publication H8-250389 (pages 4-5 and FIG. 1) and Japanese Unexamined Patent Publication No. 2002-66391 (pages 3-6 and FIGS. 1-7), for example). In the inkjet mode, a thin film of a coating solution is formed on a substrate surface by supplying the coating solution in a required minimum quantity while moving the substrate and the nozzles relative to each other. Therefore, the inkjet mode can improve the use efficiency of the coating solution over the spin coat method.

However, according to the inkjet mode, fine particles of the coating solution are jetted off to the surface of a substrate, which tends to leave irregularities of the particles on the thin film of the coating solution formed on the substrate surface. As a result, the inkjet mode has a problem of lacking in uniform film thickness.

SUMMARY OF THE INVENTION

This invention has been made having regard to the state of the art noted above, and its object is to provide a coating method and a coating apparatus which can improve the uniform film thickness of thin films of a coating solution formed in an inkjet mode.

The above object is fulfilled, according to this invention, by a coating method for forming a thin film of a coating solution on a substrate, comprising a coating solution supply step for supplying the coating solution onto the substrate from a coating solution feed mechanism having an arrangement of inkjet type nozzles; and a smoothing step for smoothing a thin film surface of the coating solution by jetting a gas to the coating solution supplied onto the substrate, while the coating solution supply step is executed.

In the method according to this invention, a gas is jetted to the coating solution supplied onto the substrate while the coating solution is supplied onto the substrate from a plurality of inkjet type nozzles in the coating solution supply step. The coating solution supplied onto the substrate from the inkjet type nozzles forms a thin film of nonuniform thickness with an uneven surface. However, the gas is jetted to the thin film surface promptly after the coating solution is supplied. Since the thin film surface is smoothed by gas pressure, the uniform film thickness of the coating solution can be improved.

In the method according to this invention, the smoothing step may be executed to jet the gas with temperature and humidity adjusted in order to inhibit drying of the coating solution supplied onto the substrate. This measure inhibits drying of the coating solution to maintain fluidity of the coating solution for a long time, which further facilitates smoothing of the thin film surface of the coating solution.

In the method according to this invention, the smoothing step may be executed to include a vapor of a solvent of the coating solution in the gas. This measure inhibits drying of the coating solution with an atmosphere of solvent vapor to maintain fluidity of the coating solution for a long time, which further facilitates smoothing of the thin film surface of the coating solution.

In the method according to this invention, the smoothing step may be executed to jet the gas obliquely to the coating solution supplied onto the substrate. This measure further facilitates smoothing of the thin film surface of the coating solution by pressure of the gas acting obliquely.

The method according to this invention may comprise a solvent supply step for supplying a solvent of the coating solution onto the substrate before the coating solution supply step. When the coating solution is supplied onto a thin film of the solvent formed on the substrate, wettability of the coating solution on the substrate is improved and the coating solution can easily spread. This can further facilitate smoothing of the surface of the thin film of the coating solution.

In the method according to this invention, a solvent supply position on the substrate in the solvent supply step, a coating solution supply position on a solvent film on the substrate in the coating solution supply step, and a gas jet position on the coating solution on the substrate in the smoothing step may adjoin one another, and supplying of the solvent, supplying of the coating solution, and jetting of the gas may be performed simultaneously in parallel. This measure minimizes a time lag between supplying of the solvent and supplying of the coating solution onto the substrate. As a result, the coating solution can be supplied onto the thin film of the solvent before evaporation of the solvent supplied onto the substrate, whereby the coating solution can easily spread on the substrate. Since the time lag between supplying of the coating solution onto the substrate and jetting of the gas also becomes short, the gas is jetted while the coating solution supplied onto the substrate retains sufficient fluidity, thereby to smooth the thin film surface of the coating solution with increased effect.

In another aspect of the invention, a coating apparatus is provided for forming a thin film of a coating solution on a substrate, comprising: a substrate holding table for holding the substrate in a horizontal position; a coating solution feed mechanism having an arrangement of inkjet type nozzles for supplying the coating solution onto the substrate; a gas jet mechanism for jetting a gas to the coating solution supplied onto the substrate to smooth a thin film surface of the coating solution; and a moving mechanism for moving the coating solution feed mechanism and the gas jet mechanism relative to the substrate held by the substrate holding table.

In the apparatus according to this invention, with the substrate holding mechanism holding the substrate horizontally, the moving mechanism moves the coating solution feed mechanism and the gas jet mechanism relative to the substrate. The coating solution feed mechanism supplies the coating solution from the inkjet type nozzles onto the substrate, thereby forming a thin film of the coating solution on the substrate. While the coating solution is supplied onto the substrate by the coating solution feed mechanism, the gas jet mechanism jets the gas to the coating solution supplied onto the substrate. As a result, irregularities on the thin film surface of the coating solution are smoothed by gas pressure, thereby to improve the uniform film thickness of the coating solution.

In the apparatus according to this invention, the gas jet mechanism may be arranged to jet the gas from a slit-shaped nozzle having a length corresponding to an arrangement length of the nozzles of the coating solution feed mechanism. This construction smoothes, all at once by the gas jetted from the slit-shaped nozzle, the thin film of the coating solution formed to have a certain width on the substrate.

In the apparatus according to this invention, the coating solution feed mechanism and the gas jet mechanism may be integrally connected together. This simplifies the construction of the moving mechanism since it becomes unnecessary to move the two mechanisms separately.

In the apparatus according to this invention, the gas jet mechanism may be attached to jet the gas obliquely to the coating solution supplied onto the substrate. This construction further facilitates smoothing of the thin film surface of the coating solution by pressure of the gas acting obliquely.

The apparatus according to this invention may comprise a solvent feed mechanism disposed forward with respect to a direction of movement relative to the substrate of the coating solution feed mechanism and the gas jet mechanism, for supplying a solvent of the coating solution onto the substrate. With this construction, the solvent feed mechanism first forms a thin film of the solvent on the substrate, and subsequently the coating solution feed mechanism supplies the coating solution onto the thin film of the solvent. Then, wettability of the coating solution on the substrate is improved and the coating solution can easily spread. This can further facilitate smoothing of the surface of the thin film of the coating solution.

In the apparatus according to this invention, the solvent feed mechanism may, for example, have an arrangement of inkjet type nozzles for supplying the solvent of the coating solution onto the substrate. In another example, the solvent feed mechanism may supply the solvent of the coating solution to an interior of a cylindrical body having numerous discharge bores, and apply vibration to the solvent, thereby to discharge droplets of the solvent from the discharge bores. The solvent feed mechanism in these examples can form the thin film of the solvent on the substrate relatively easily.

In the apparatus according to this invention, the coating solution feed mechanism, the gas jet mechanism, and the solvent feed mechanism may be connected to be constructed integrally. This simplifies the construction of the moving mechanism since it becomes unnecessary to move the coating solution feed mechanism, the gas jet mechanism, and the solvent feed mechanism separately.

In the apparatus according to this invention, the solvent feed mechanism, the coating solution feed mechanism, and the gas jet mechanism may be arranged such that a position where the solvent feed mechanism supplies the solvent onto the substrate, a position where the coating solution feed mechanism supplies the coating solution onto a solvent film on the substrate, and a position where the gas jet mechanism jets the gas to the coating solution on the substrate adjoin one another. This construction minimizes a time lag between supplying of the solvent and supplying of the coating solution onto the substrate by moving the solvent feed mechanism, the coating solution feed mechanism and the gas jet mechanism together. As a result, the coating solution can be supplied onto the thin film of the solvent before evaporation of the solvent supplied onto the substrate, whereby the coating solution can easily spread on the substrate. Since the time lag between supplying of the coating solution onto the substrate and jetting of the gas also becomes short, the gas is jetted while the coating solution supplied onto the substrate retains sufficient fluidity, thereby to smooth the thin film surface of the coating solution with increased effect.

The apparatus according to this invention may comprise a temperature control mechanism attached to and constructed integrally with the coating solution feed mechanism, the gas jet mechanism, and the solvent feed mechanism. This construction can maintain the temperature of each of the coating solution, gas and solvent uniform. As a result, the coating solution can be applied in a stable temperature condition, thereby to promote the uniform film thickness of the coating solution.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIGS. 6Aa to 6Ad and 6Ba to 6Bd are views showing a coating procedure using the coating apparatus in the embodiment.

DESCRIPTION OF THE PREFERRED EMBODIMENTS

A preferred embodiment of this invention will be described in detail hereinafter with reference to the drawings.

Figure 1:
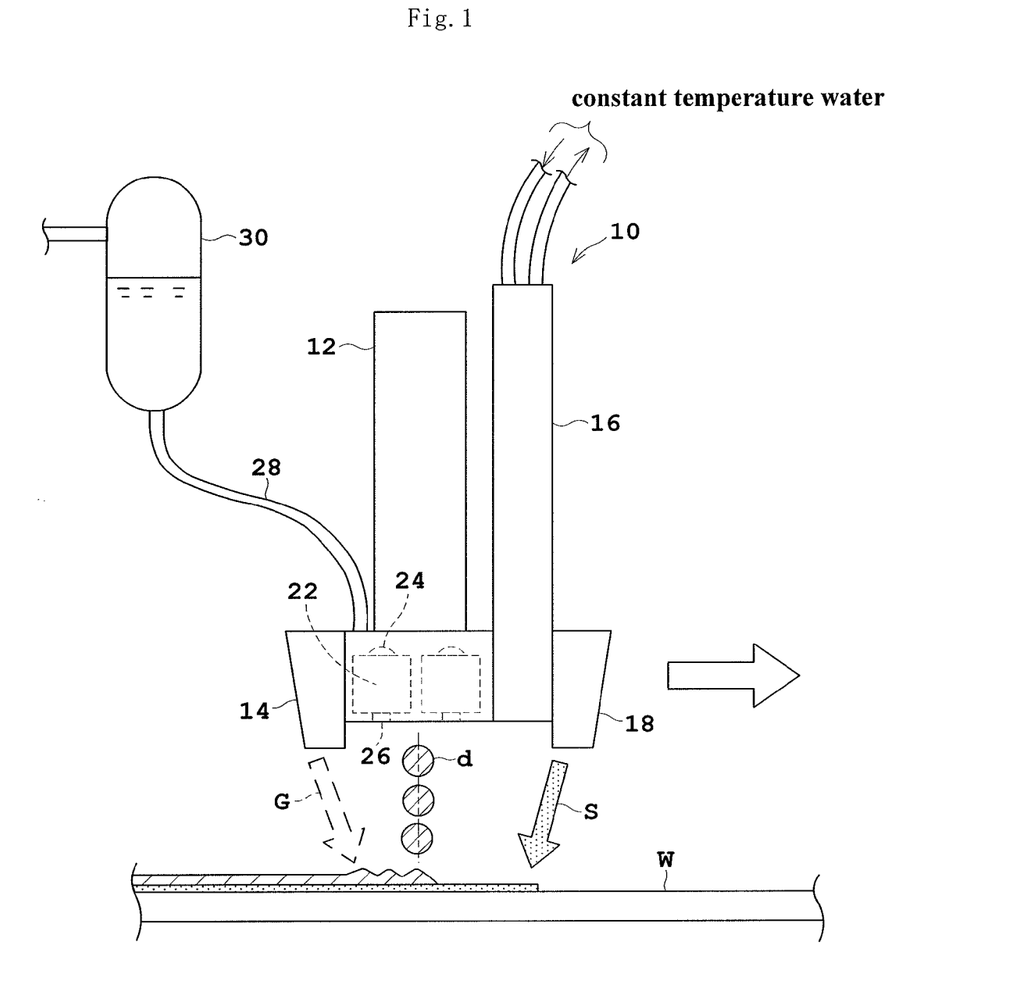
FIG. 1 is a side view of a principal portion of a coating apparatus in one embodiment of this invention.

FIG. 1 is a side view of a principal portion of a coating apparatus in one embodiment of this invention.

<Outline Construction of Coating Head 10>

A coating apparatus for applying a photoresist to semiconductor wafers will be described by way of example. This coating apparatus includes a coating head 10 for applying a coating solution which is the photoresist to a wafer W which is a semiconductor wafer. The coating head 10 is constructed movable relative to the wafer W as opposed to the wafer W, which moves rightward as indicated by an arrow in FIG. 1.

The coating head 10 has a coating solution feed mechanism 12 with an arrangement of a plurality of inkjet type nozzles. A gas jet mechanism 14 is disposed adjacent the coating solution feed mechanism 12, and more particularly is connected integrally to a side surface of the coating solution feed mechanism 12, i.e. a rearward side thereof with respect to the direction of movement of the coating head 10. The gas jet mechanism 14 serves to jet a gas (air in this embodiment) to the coating solution supplied onto the wafer W, thereby to smooth a thin film surface of the coating solution. A solvent feed mechanism 18 is integrally connected through a temperature control mechanism 16 to a side surface of the coating solution feed mechanism 12, i.e. a forward side thereof with respect to the direction of movement of the coating head 10. The temperature control mechanism 16 is provided for circulating constant temperature water to maintain constant the temperature of the coating head 10, particularly that of the coating solution in the coating solution feed mechanism 12. The solvent feed mechanism 18 is provided for supplying a solvent of the coating solution onto the wafer W. The construction of each component will be described in detail hereinafter.

<Construction of Coating Solution Feed Mechanism 12>

Figure 2A:
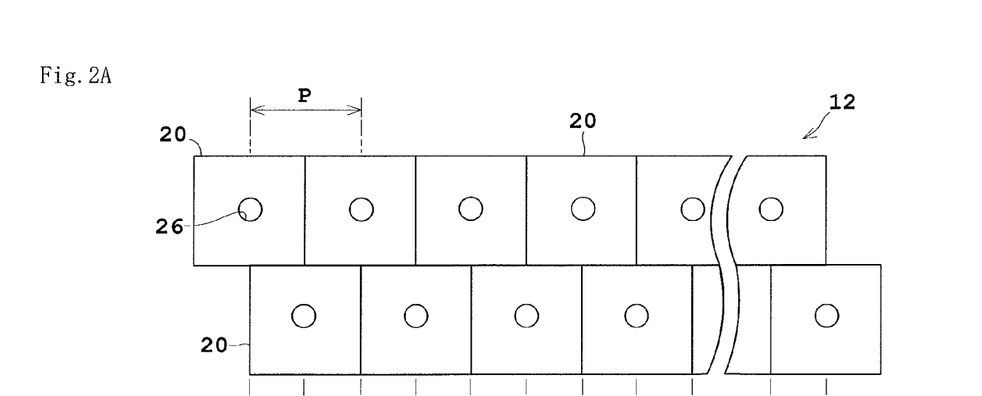
FIGS. 2A and 2B are views showing nozzle arrays of a coating solution feed mechanism of the coating apparatus.
Figure 2B:
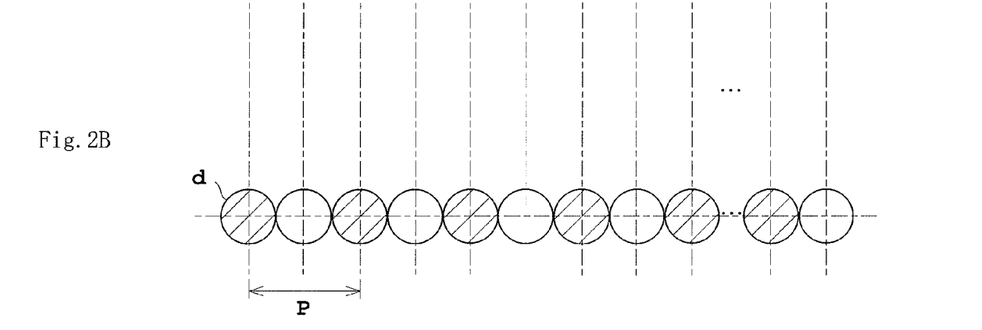

As shown in FIG. 2A, the coating solution feed mechanism 12 has inkjet type nozzles 20 arranged zigzag. FIG. 2A is a bottom view of the coating solution feed mechanism 12. An arrangement pitch P of the nozzle 20 in each row is about 0.1 to 0.2 mm. The coating solution feed mechanism 12 has several tens to several hundreds of nozzles 20. As shown in FIG. 1, each nozzle 20 has a reservoir 22 for temporarily storing the coating solution. A piezo element 24 is disposed on an upper wall of the reservoir 22. When voltage is applied to this piezo element 24, the piezo element 24 will become recessed to discharge the coating solution in the reservoir 22 from a discharge bore 26 formed in a bottom surface thereof. Discharge timing of the nozzles 20 in the respective lines of the zigzag arrangement is adjusted whereby, on the wafer W, as shown in FIG. 2B, dots d of the coating solution are aligned in one row without gaps. Each dot d is about 0.05 to 0.1 mm in diameter, and has a volume of the coating solution of about 10 to 50 picoliters. The volume of the coating solution supplied from the nozzles 20 is controlled by level and pulse interval of a pulse voltage applied to the piezo elements 24. The coating solution is supplied to the reservoir 22 of each nozzle 20 from a coating solution tank 30 through piping 28.

<Construction of Gas Jet Mechanism 14>

Figure 5A:
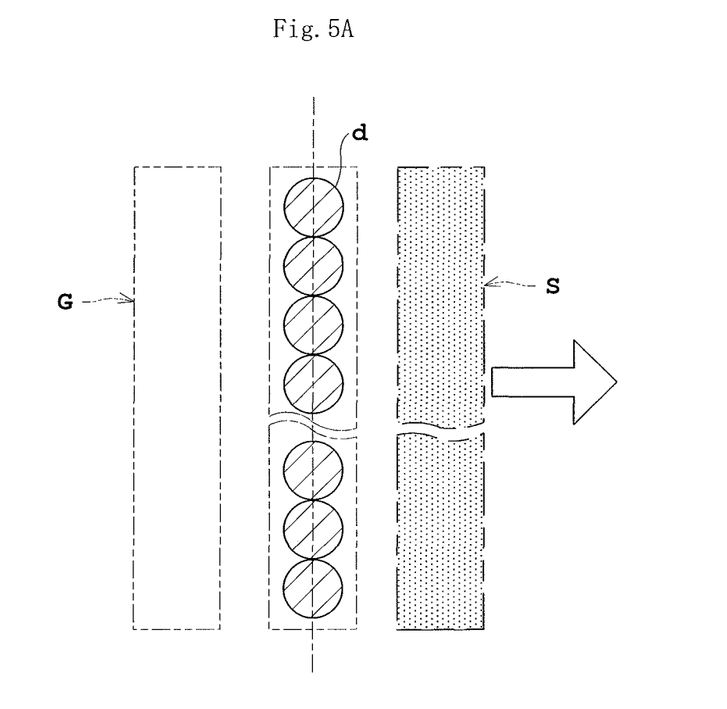
FIGS. 5A and 5B are explanatory views of a coating method in the embodiment of this invention.
Figure 5B:
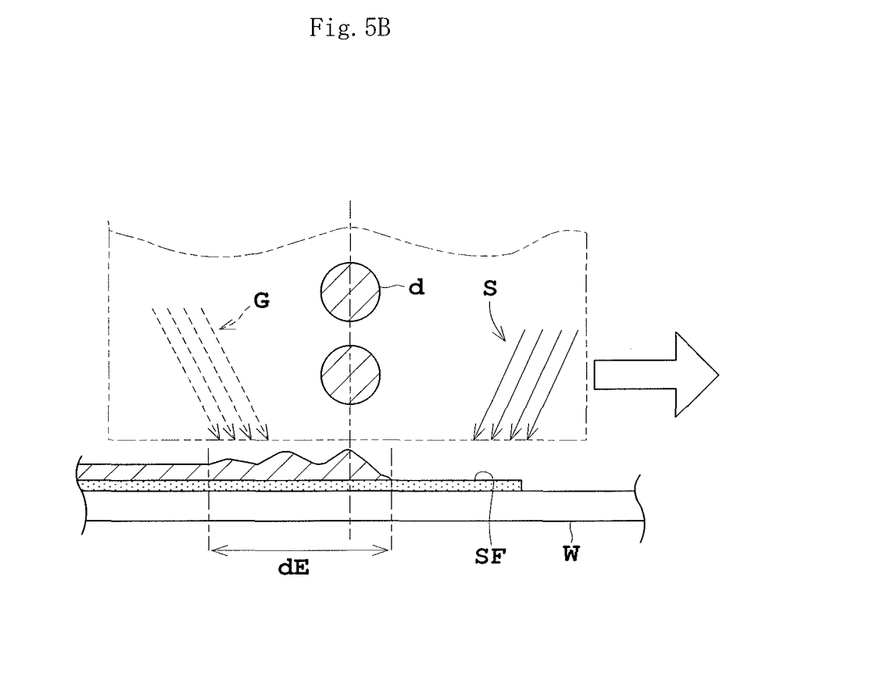

The gas jet mechanism 14 has a slit-shaped nozzle with a length equivalent to an arrangement length of the nozzles 20 of the coating solution feed mechanism 12. As shown in FIGS. 1 and 5, the gas jet mechanism 14 is attached and arranged to jet gas G obliquely to the coating solution dE (particularly to an uneven surface portion of the coating solution immediately after the dots d of the coating solution are formed on the wafer W) supplied onto the wafer W. The gas with adjusted temperature and humidity is introduced into the gas jet mechanism 14 in order to inhibit drying of the coating solution dE (particularly the above-noted portion of the coating solution) supplied onto the wafer W. The above temperature and humidity of the gas are those comparable to the coating environment for a general spin coater. Preferably, for example, the temperature is controlled to 23±0.2° C., and relative humidity to 45±0.2%.

<Construction of Solvent Feed Mechanism 18>

As does the coating solution feed mechanism 12, the solvent feed mechanism 18 has an arrangement of inkjet type nozzles. In order to spread solvent S over an area of the coating solution to be supplied onto the wafer W by the coating solution feed mechanism 12, an arrangement length of the nozzles is set to an extent similar to that of the coating solution feed mechanism 12. The solvent is selected as appropriate according to the type of coating solution. Where the coating solution is a photoresist, for example, it is preferable to use PGMEA, emulsifying ethyl or the like usually included in the photoresist. The solvent is not limited to these, but may be any volatile solvent such as IPA, for example.

<Construction of Coating Head 10>

The coating head 10 has the above-noted coating solution feed mechanism 12, gas jet mechanism 14, temperature control mechanism 16, and solvent feed mechanism 18 connected together to form an integrated whole. When the coating head 10 moves relative to the wafer W as opposed thereto, the above constituents move all together such that the solvent feed mechanism 18 moves in front with respect to the direction of movement of the coating head 10, the coating solution feed mechanism 12 follows next, and the gas jet mechanism 14 comes last. The spacing between the coating head 10 and the wafer W is in the order of 1 mm.

<Entire Construction of the Coating Apparatus>

Figure 3:
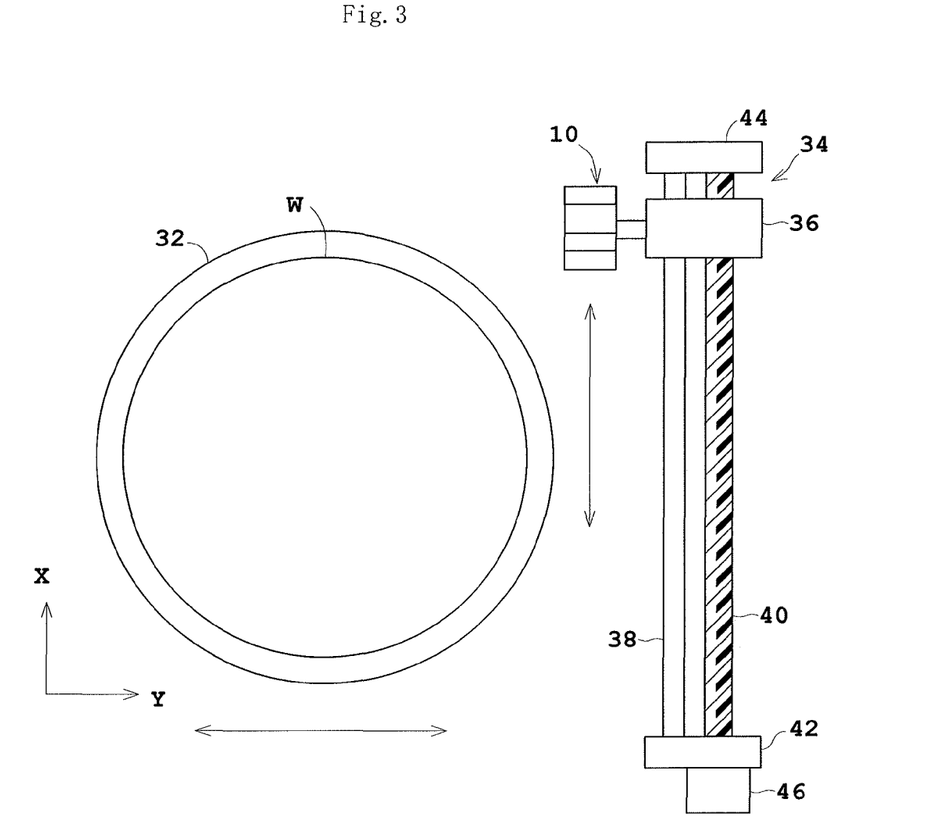
FIG. 3 is an overall plan view of the coating apparatus in the embodiment of this invention.
Figure 4:
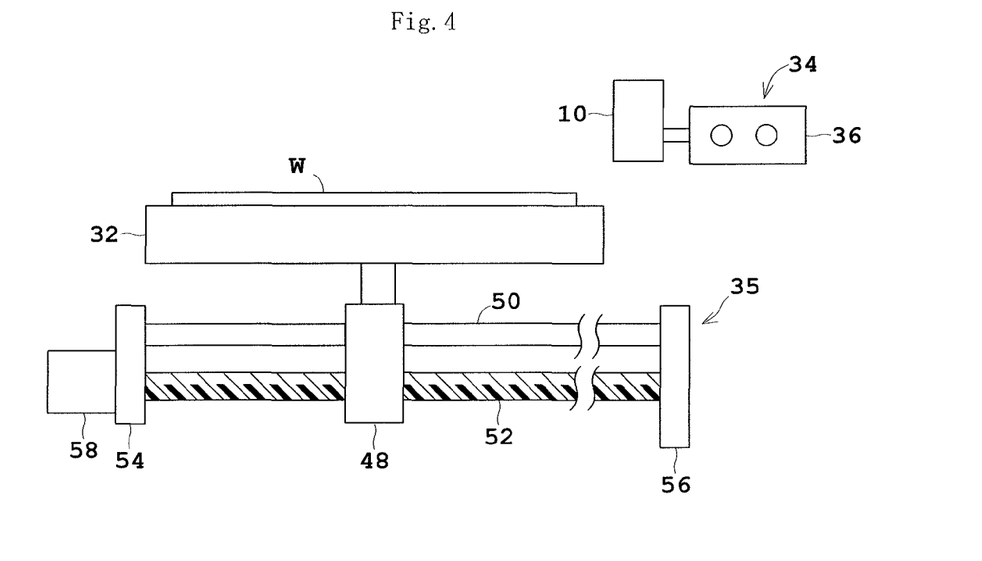
FIG. 4 is an overall front view of the coating apparatus.

Next, an example of the construction of the coating apparatus having the above coating head 10 will be described with reference to FIGS. 3 and 4. FIG. 3 is an overall plan view of the coating apparatus. FIG. 4 is an overall front view of the coating apparatus.

This coating apparatus has a substrate holding table 32 for holding in a horizontal position the wafer W to which the coating solution is applied. As shown in FIG. 3, a first moving mechanism 34 is juxtaposed to the substrate holding table 32 in plan view for moving the coating head 10 forward and backward along one direction (X-direction). Further, as shown in FIG. 4, a second moving mechanism 35 is disposed below the substrate holding table 32 for moving the substrate holding table 32 forward and backward along a direction (Y-direction) perpendicular to the moving direction of the coating head 10. The first moving mechanism 34 and second moving mechanism 35 correspond to the moving mechanism in this invention. Constructions of the respective moving mechanisms 34 and 35 will be described hereinafter.

<Construction of First Moving Mechanism 34>

The first moving mechanism 34 has a moving block 36 movable horizontally while supporting the coating head 10 in a cantilever fashion. The moving block 36 is penetrated by a guide member 38 to be guided in X-direction. Further, a ball screw 40 extends parallel to the guide member 38 and is meshed with the moving block 36. The guide member 38 and ball screw 40 are each supported at opposite ends thereof by support plates 42 and 44. An electric motor 46 is connected to one end of the ball screw 40. With forward and backward rotations of the electric motor 46, the ball screw 40 rotates forward and backward. As a result, the coating head 10 is moved together with the moving block 36 forward and backward along X-direction.

<Construction of Second Moving Mechanism 35>

The second moving mechanism 35 is similar in construction to the first moving mechanism 34. That is, the second moving mechanism 35 has a moving block 48 for supporting the substrate holding table 32, a guide member 50 for guiding this moving block 48 in Y-direction, a ball screw 52 meshed with the moving block 48, support plates 54 and 56 for supporting opposite ends of the guide member 50 and ball screw 52, and an electric motor 58 connected to one end of the ball screw 52. With forward and backward rotations of the electric motor 58, the ball screw 52 rotates forward and backward. As a result, the substrate holding table 32 is moved together with the moving block 48 forward and backward along Y-direction.

<Operation of the Coating Apparatus>

Figure 6:
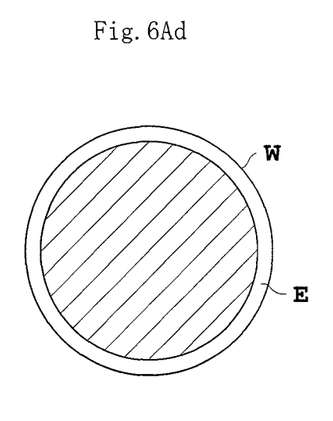

Operation of the coating apparatus according to this embodiment will be described hereinafter referring also to FIGS. 5 and 6. FIGS. 5A and 5B are explanatory views of a coating method according to the embodiment. FIGS. 6Aa to 6Ad and 6Ba to 6Bd are views showing a coating procedure using the coating apparatus in the embodiment.

First, a wafer W is placed in a horizontal position on the substrate holding table 32 (see FIGS. 3, 4, 6Aa and 6Ba). Then, the first moving mechanism 34 and second moving mechanism 35 are operated as appropriate to move the coating head 10 to a coating start position P1 (see FIG. 6Aa).

While the coating head 10 is moved in −X-direction from the coating start position P1, the solvent feed mechanism 18 of the coating head 10 supplies the solvent of the coating solution onto the wafer W (solvent supply step). In parallel with the solvent supply step, the coating solution feed mechanism 12 supplies the coating solution onto a solvent film on the wafer W (coating solution supply step). Further, in parallel with the solvent supply step and the coating solution supply step, the gas jet mechanism 14 jets the gas to the coating solution supplied onto the wafer W to smooth the thin film surface of the coating solution (smoothing step). Each of these steps will be described in detail hereinafter.

The coating solution is applied to the wafer W while carrying out the above solvent supply step, coating solution supply step, and smoothing step simultaneously in parallel. Specifically, with the coating head 10 caused by the first moving mechanism 34 to scan in −X-direction from the coating start position P1 in FIG. 6Aa, the coating solution is applied to a first area A1 which is an end area of the wafer W. After the coating of the first area A1 is completed, the coating head 10 is moved in X-direction, and the substrate holding table 32 is moved in −Y-direction by the second drive mechanism 35, whereby the coating head 10 moves to a coating start position P2 of an adjoining second area A2. Then, the coating solution is applied to the second area A2 while carrying out the solvent supply step, coating solution supply step, and smoothing step simultaneously in parallel (see FIGS. 6Ab and 6Bb). After the coating of the second area A2 is completed, the coating head 10 is moved to a coating start position P3 of an adjoining third area A3, and the coating solution is applied to the third area A3 similarly (see FIGS. 6Ac and 6Bc). The above operation is repeated to apply the coating solution to the entire surface of the wafer W (see FIGS. 6Ad and 6Bd).

In this embodiment, the coating solution is not applied to a marginal area E adjacent the edge of the wafer W (see FIGS. 6Ad and 6Bd). The reason is as follows. When the coating solutions such as photoresist is applied to the edge of the wafer W, this coating solution will be detached from the wafer W by contact with a receiving groove of a substrate transport mechanism or a substrate storage cassette, for example, thereby to become a cause of particle generation. Conventionally, in order to prevent such particle generation, an edge cleaning device is used to supply a cleaning liquid only to an area within a certain range from the edge of the wafer W, to wash away the coating solution applied to the area adjacent the edge of the wafer W.

However, where the coating apparatus according to this embodiment is used, the nozzles 20 of the coating head 10 supply the coating solution to the surface of the wafer W when arranged in positions opposed to the areas other than the area E adjacent the edge of the wafer W. This can prevent the coating solution from being applied to the area E adjacent the edge of the wafer W, and enables omission of the edge cleaning process by the edge cleaning device. In this case, on-off control is carried out individually of the piezo elements 24 in the respective nozzles 20.

<Details of the Solvent Supply Step, Coating Solution Supply Step and Smoothing Step>

Next, the solvent supply step, coating solution supply step, and smoothing step using the coating head 10 will be described with reference to FIGS. 5A and 5B. FIG. 5A is a plan view showing a solvent supply position, a coating solution supply position, and a gas jet position on the wafer W. FIG. 5B is a front view showing the above positions. The solvent supply position, the coating solution supply position, and the gas jet position adjoin one another on the wafer W. Specifically, as opposed to the coating solution feed mechanism 12 supplying dots d of the coating solution substantially vertically downward to the wafer W, the solvent feed mechanism 18 supplies the solvent obliquely toward the position of the coating solution feed mechanism 12 (rearward with respect to the direction of movement of the coating head 10). Consequently, the solvent supply position adjoins the coating solution supply position. On the other hand, the gas jet mechanism 14 supplies the gas likewise obliquely toward the position of the coating solution feed mechanism 12 (forward with respect to the direction of movement of the coating head 10). Consequently, the gas jet position adjoins the coating solution supply position.

By making the solvent supply position approach and adjoin the coating solution supply position as described above, the coating solution can be supplied onto the film of the solvent before evaporation and drying of the solvent supplied to the wafer W. As a result, wettability of the coating solution relative to the wafer W is improved and the coating solution can easily spread, thereby to improve the uniform film thickness of the coating solution. By making the gas jet position approach and adjoin the coating solution supply position, the uneven surface of the coating solution is smoothed by gas pressure before hardening through evaporation and drying of the supplied coating solution, thereby to further improve the uniform film thickness of the coating solution.

As schematically shown in FIG. 5B, with the coating head 10 and the wafer W making relative movement as opposed to each other, thin solvent film SF is formed on the wafer W by the solvent S supplied from the solvent feed mechanism 12. Then, the dots d of the coating solution are supplied from the coating solution feed mechanism 12 onto the thin solvent film SF, whereby the uneven area dE of the thin film of the coating solution is formed on the thin solvent film SF. The uneven area dE of the thin film of the coating solution is smoothed by the pressure of jetted gas G.

The coating solution can be coated and formed uniformly on the wafer W by carrying out the above solvent supply step, coating solution supply step, and smoothing step simultaneously in parallel. Moreover, since the coating solution is supplied in the inkjet mode, use efficiency of the coating solution can be improved. Since there is no need to rotate the wafer W at high speed in order to make the thickness of the coating solution uniform, inner surfaces of a cup are not contaminated with the coating solution scattering therein. Thus, the apparatus is easy to maintain and control.

This invention is not limited to the foregoing embodiment, but may be modified as follows:

(1) In the foregoing embodiment, the solvent supply step is executed before the coating solution supply step. However, where wettability of the coating solution relative to the substrate is fully secured, the solvent supply step may be omitted.

(2) In the foregoing embodiment, the smoothing step is executed to jet air to the coating solution supplied onto the substrate. This air may include vapor of the solvent of the coating solution. Use of the air including the vapor of the solvent will inhibit drying and hardening of the coating solution on the substrate, which will further facilitate spreading of the coating solution on the substrate. As a result, the thickness of the coating solution will be made further uniform. Nitrogen gas may be used in place of air.

(3) In the foregoing embodiment, the solvent feed mechanism is connected to the coating head as integral part thereof to execute the solvent supply step immediately before the coating solution supply step. Instead, the solvent may be applied to the entire substrate first, with the smoothing step carried out subsequently while carrying out the coating solution supply step.

(4) In the foregoing embodiment, the moving mechanism of this invention is constructed of the first moving mechanism 34 for moving the coating head 10 in X-direction and the second moving mechanism 35 for moving the substrate holding table 32 in Y-direction. However, the invention is not limited to this construction. For example, the moving mechanism may be constructed of a mechanism for fixing the substrate holding table and a mechanism for moving the coating head in X-direction and Y-direction. Alternatively, the moving mechanism may be constructed of a mechanism for fixing the coating head and a mechanism for moving the substrate holding table in X-direction and Y-direction.

(5) In the foregoing embodiment, the gas jet mechanism has one slit-shaped nozzle. Instead, the gas jet mechanism may have a plurality of usual small-bore nozzles. The plurality of nozzles may jet the gas in varied directions to smooth the coating solution in a plurality of directions.

(6) It is not necessary to connect the gas jet mechanism to the coating solution feed mechanism to form the integral construction. These mechanisms may be constructed separately to be movable individually.

(7) In the foregoing embodiment, the solvent feed mechanism has an arrangement of inkjet type nozzles as does the coating solution feed mechanism. The invention is not limited to this construction. The solvent feed mechanism may have a different construction, for example, a construction for spraying the solvent from spray nozzles. In addition, for example, a droplet discharge mechanism may be constructed to supply the solvent of the coating solution to the interior of a cylindrical body having numerous discharge bores and apply vibration to this solvent, thereby to discharge droplets of the solvent from the discharge bores. Such a droplet discharge mechanism is constructed to include small bores arranged in a row axially of the cylindrical body, and piezo elements applied to a surface of the cylindrical body opposite the surface where these small bores are formed.

This invention may be embodied in other specific forms without departing from the spirit or essential attributes thereof and, accordingly, reference should be made to the appended claims, rather than to the foregoing specification, as indicating the scope of the invention.

What is claimed is:

1. A coating method for forming a thin film of a coating solution on a substrate, comprising:

a coating solution supply step of supplying the coating solution onto the substrate from a coating solution feed mechanism having an arrangement of inkjet nozzles;

a smoothing step of smoothing a thin film surface of the coating solution by jetting a gas from a gas jet mechanism to the coating solution supplied onto the substrate; and a solvent supply step of supplying a solvent of the coating solution from a solvent feed mechanism onto the substrate before the coating solution supply step;

wherein the coating solution feed mechanism moves in a direction of movement while supplying the coating solution;

the gas jet mechanism jets the gas obliquely forward in the direction of movement while moving integrally with the coating solution feed mechanism, while disposed rearward of the coating solution feed mechanism with respect to the direction of movement; and the solvent feed mechanism supplies the solvent only obliquely rearward in the direction of movement while moving integrally with the coating solution feed mechanism, the solvent feed mechanism being disposed forward of the coating solution feed mechanism with respect to the direction of movement;

whereby the coating solution feed mechanism supplies the coating solution onto a thin film of the solvent.

2. The method according to claim 1 wherein the smoothing step is executed to jet the gas with temperature and humidity adjusted in order to inhibit drying of the coating solution supplied onto the substrate.

3. The method according to claim 1 wherein the smoothing step is executed to include a vapor of a solvent of the coating solution in the gas.

4. The method according to claim 1 wherein a solvent supply position on the substrate in the solvent supply step, a coating solution supply position on a solvent film on the substrate in the coating solution supply step, and a gas jet position on the coating solution on the substrate in the smoothing step adjoin one another, and supplying of the solvent, supplying of the coating solution, and jetting of the gas are performed simultaneously in parallel.

* * * * *